US006730530B2

(12) United States Patent
Fuwausa et al.

(10) Patent No.: US 6,730,530 B2
(45) Date of Patent: May 4, 2004

(54) SEMICONDUCTOR LIGHT EMITTING ELEMENT FORMED ON A CLEAR OR TRANSLUCENT SUBSTRATE

(75) Inventors: Michelle Jillian Fuwausa, Columbia, MD (US); Kevie Dowhower, Santa Maria, CA (US)

(73) Assignee: Luminary Logic Ltd, Columbia, MD (US)

( * ) Notice: Subject to any disclaimer, the term of this patent is extended or adjusted under 35 U.S.C. 154(b) by 0 days.

(21) Appl. No.: 10/303,461

(22) Filed: Nov. 25, 2002

(65) Prior Publication Data
US 2003/0071270 A1 Apr. 17, 2003

Related U.S. Application Data

(62) Division of application No. 09/659,189, filed on Sep. 12, 2000, now Pat. No. 6,486,561.

(51) Int. Cl.[7] .............................................. H01L 21/00
(52) U.S. Cl. ............................ 438/22; 438/26; 362/23; 362/29
(58) Field of Search .................. 438/22, 26; 362/23–29

(56) References Cited

U.S. PATENT DOCUMENTS

| 3,611,065 | A | * | 10/1971 | Zschauer et al. ............ 257/717 |
| 4,115,994 | A | * | 9/1978 | Tomlinson ................... 368/241 |
| 4,827,290 | A | * | 5/1989 | Yoritomo et al. ............ 347/245 |
| 5,442,239 | A | * | 8/1995 | DiGiacomo et al. ......... 257/781 |
| 5,546,496 | A | * | 8/1996 | Kimoto et al. .............. 385/146 |
| 6,106,127 | A | * | 8/2000 | Fuwausa ....................... 362/29 |
| 6,256,437 | B1 | * | 7/2001 | Sakushima et al. ........... 385/49 |
| 6,282,352 | B1 | * | 8/2001 | Kato et al. .................... 385/92 |
| 6,486,561 | B1 | * | 11/2002 | Fuwausa et al. ............. 257/777 |

* cited by examiner

*Primary Examiner*—Michael Trinh
*Assistant Examiner*—Jeff Vockrodt
(74) *Attorney, Agent, or Firm*—Gottlieb, Rackman & Reisman, P.C.

(57) ABSTRACT

This invention provides a novel application of a semiconductor light emitting element or light emitting chip preferably disposed on the underside surface of a clear or translucent substrate. In addition connecting wires leading from said element to the perimeter of the substrate connecting to contact pads leading to a circuit board. The conductors are deposited on the substrate using thin film technology. Preferably the light emitting element is packaged in a flip chip having connecting bumps only on one side.

11 Claims, 4 Drawing Sheets

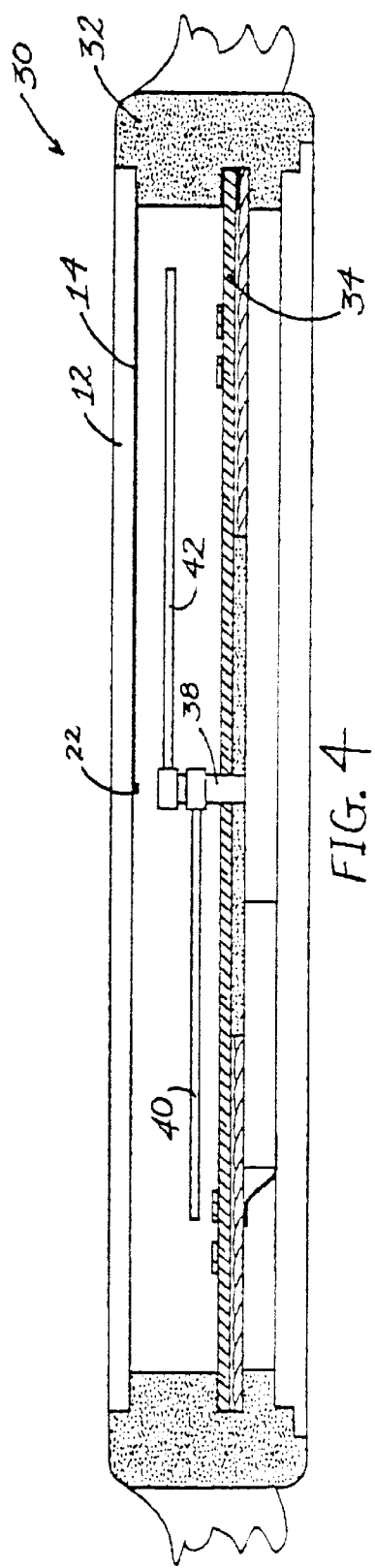
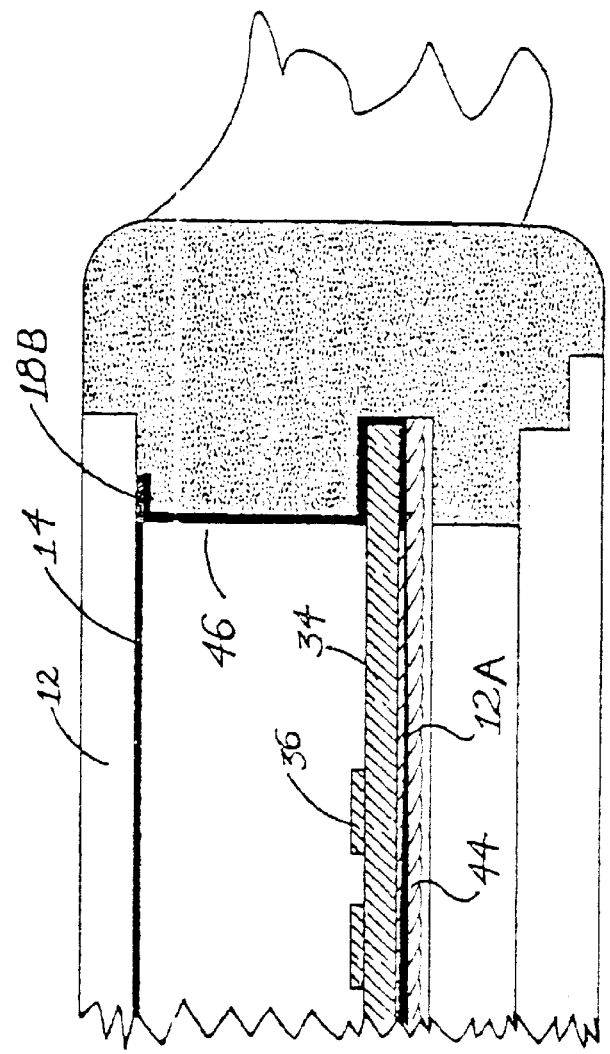

SEMICONDUCTOR LIGHT EMITTING ELEMENT FORMED ON A CLEAR OR TRANSLUCENT SUBSTRATE

This application is a divisional of Ser. No. 09/659,189, filed Sep. 12, 2000, now U.S. Pat. No. 6,486,561.

BACKGROUND OF THE INVENTION

A. Field of Invention

The present invention relates generally to electronic devices and specifically to a semiconductor light emitting element formed and positioned on the surface of a clear or translucent substrate providing a more efficient and even distribution of lighting and therefore improving the viewing of an item or object at night or in low light conditions. The substrate may form or be a part of protective shield, lens or cover of an object being illuminated.

B. Description of the Prior Art

Illumination is widely used in the electronic industry on products ranging from cellular telephones, calculators, watches, hand-held computers, global positioning units and gauges. Illuminating devices are also used in many other industries such as in automobiles, signs, advertising and ornamentation.

Light emitting diodes have many advantages over competing lighting elements such as electroluminescent, phosphorescent, flourescent elements as well as LCD and incandescent elements in areas such as size, cost, color variables, reliability, and power consumption.

Semiconductor light emitting diodes have been used in cellular phones, watches and other electronics but their illumination has been limited due to their positioning underneath, embedment inside a crystal or from the side of the light transmissive item receiving the illumination as described in U.S. Pat. No. 6,017,127—Timex, U.S. Pat. No. 3,899,871—Seiko, U.S. Pat. No. 4,115,994—Tomlinson.

Electroluminescent lighting, hereinafter referred to as EL, has been in widespread use in the electronic industry and is usually positioned underneath the item or object such as watch dials or other surfaces as described in U.S. Pat. No. 3,749,977—Sliker, U.S. Pat. No. 4,775,964—Timex, U.S. Pat. No. 4,208,869—Hanaoka In these references the direct illumination is provided upward towards the viewer restricting any aesthetic aspects. Another disadvantage of EL's is that they require complicated auxiliary circuitry and limited colors to the consumer market.

OBJECTIVES AND SUMMARY OF THE INVENTION

Accordingly, it is an objective of the present invention to provide an improved and efficient illumination apparatus for viewing an item or object by positioning an illumination device to direct light in a direction towards the subject to be illuminated making viewing easier, more efficient and less stressful to the viewer.

A further objective of this invention is to remove the semiconductor light emitting diode packaging including the reflective directional cone and the surrounding glass or plastic protective barrier, therefore leaving the light emitting element in its raw form which when applied to the undersurface of the clear or translucent substrate radiates in a 180-degree angle and when in off mode leaves the lighting apparatus virtually invisible.

It is another objective of the present invention to provide an illumination device for electronic devices such as: cellular phones, watches, hand-held computers, global positioning units, gauges, automobiles, signs, advertising and ornamental devices eliminating any EL as the primary illumination source and its associated circuitry.

Another objective is to group semiconductor light emitting diode chips which could be red, green and blue configuration centrally or in selected areas of the substrate regulated independently by a circuit or ASICS chip with resistors limiting electrical current providing an unlimited spectrum of colors.

Another objective is to allow constant or preprogrammed illumination variables, which could be activated from a power source with a preprogrammed electronic circuit or a programmable ASICS chip and is controlled by an actuator switch, which could be within close proximity of the item or object.

These and other objects of the invention, together with features and advantages thereof will become apparent from the following detailed description of the preferred embodiment, the appended claims and the accompanying drawings.

An illuminating device is disclosed which is formed of a substrate made of a transparent, translucent or opaque. A plurality of conductors are formed on the substrate using thin film deposition techniques. The conductors may include several coextensive layers, including a layer of chromium, a layer of nicker and a layer of gold. A protective layer is then applied to cover and protect the conductors.

The device further includes one or more light emitting elements, each element being formed of semiconductor materials forming a semiconductor junctions. Importantly, no lenses are provided to concentrate light from these elements thereby insuring the light is evenly distributed as it propagates away from the device. Preferrably the light emitting element or elements are packaged in a flip chip having connecting bumps on one side. Therefore the chip can be directly connected to the conductors.

The device may be formed with several light emitting elements arranged into multicolored groups. Each group includes a red, a green and a blue element. The groups can then be activated to form a static or moving colored image.

BRIEF DESCRIPTION OF THE DRAWINGS

FIG. 4 shows a sectional view of a watch incorporating the subject illumination device;

FIG. 5 is an enlarged sectional view of the watch of FIG. 4; and

DETAILED DESCRIPTION OF THE INVENTION

Figure 1:
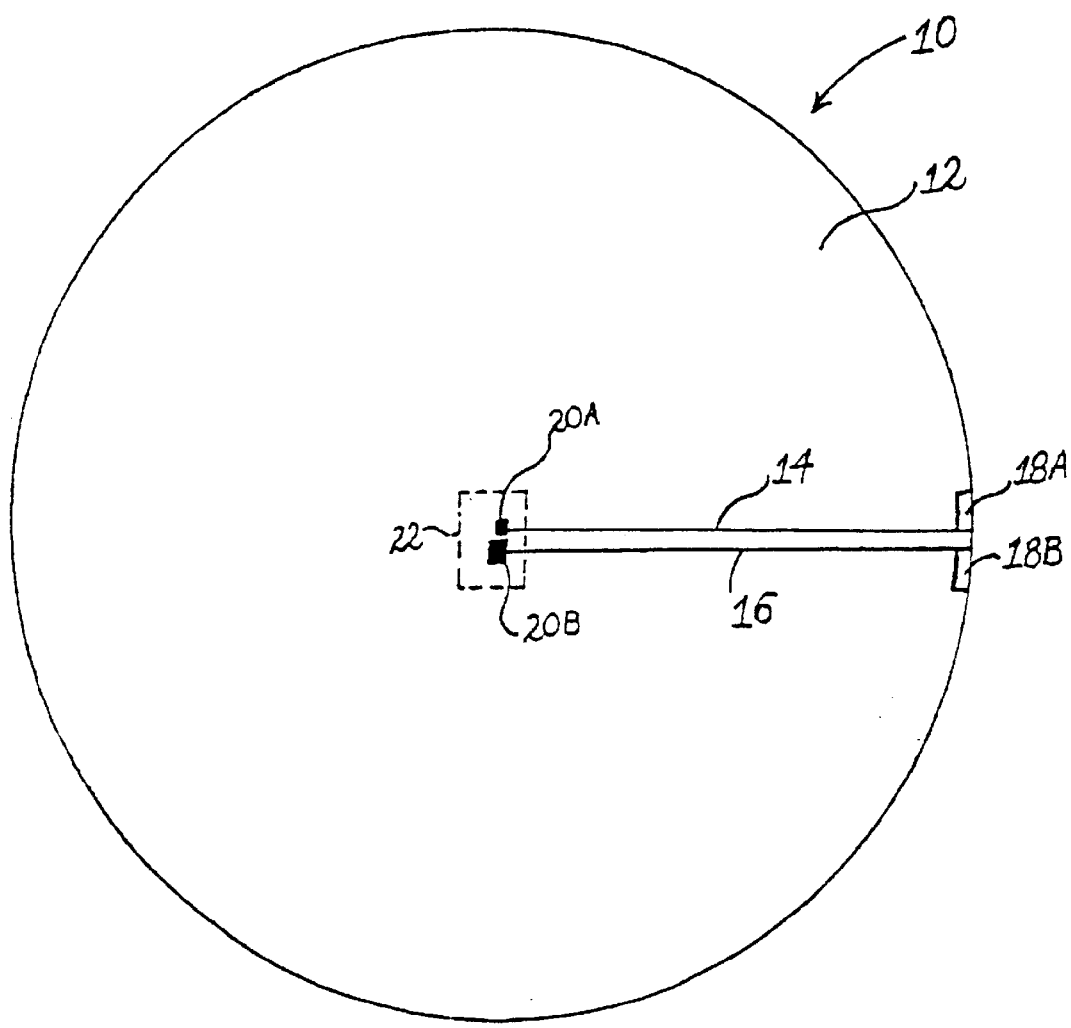
FIG. 1 shows a plan view of an illumination device constructed in accordance with this invention.
Figure 2:
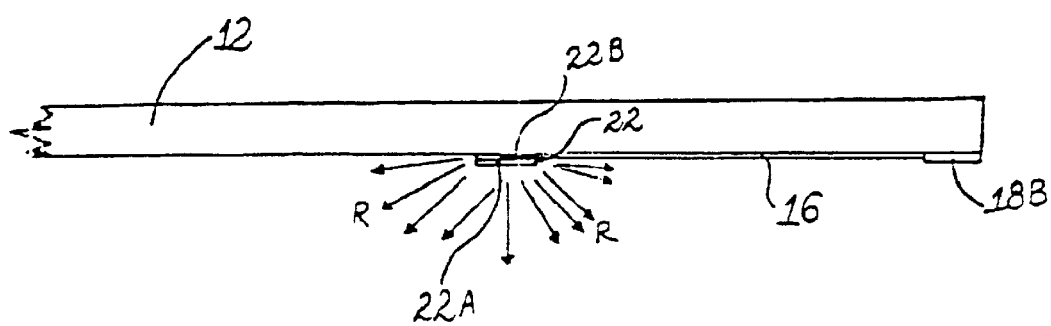
FIG. 2 shows a sectional view of the device of FIG. 1.

FIGS. 1 and 2 shows an illumination device constructed in accordance with this invention. The device 10 includes a substrate 12 which in one embodiment of the invention is made of a transparent or translucent material such as a glass, quartz or crystal. The substrate 12 can have a circular shape, as shown in FIG. 1, a rectangular, a square shape, or any other regular or irregular shape desired. Two conductors 14, 16 are formed on the substrate 12 using semiconductor techniques, as described in more detail below. The conductors 14, 16 extend from two connectors 18A, 18B preferably disposed near an edge of the substrate 12. The other ends of the conductors 14, 16 consist of bonding pads 20A, 20B, respectively. A light emitting element 22 is secured to the pads 20A, 20B (in FIG. 1, element 22 is shown in phantom lines). Preferably the element 22 is provided in form of a flip chip which has connecting bumps (not shown) on only one surface 22A. Flip chips and methods of attaching the same to a substrate are disclosed for example in U.S. Pat. No. 5,869,886 (incorporated herein by reference). Therefore the element 22 can be mounted on substrate 12 solidly and without any connectors or leads required from its top surface 22A. The element 22 is oriented so when it is energized by current from conductors 14 and 16, it generates light, as indicated symbolically in FIG. 2 by rays R. Alternatively, instead of a flip chip, element 22 may be a light emitting element with one connection on each of the surfaces 22A and 22B as shown in commonly assigned U.S. Pat. No. 6,106,127 incorporated herein by reference. Light emitting elements of these kinds are available in a variety of colors from Agilent Technologies, a subsidiary of the Hewlett Packard Company, and Sharp Corporation of Japan.

Light emitting diodes are semiconductor devices that are readily available in a large variety of sizes, power output color, configuration, etc. A typical light emitting diode consists of a light emitting element and a lens. The light emitting element is made of two semiconductor materials forming a junction so that when a current flows across the junction, light is generated. This light is then intercepted by the lens and directed in a predetermined direction. To the inventor's knowledge, no illuminating devices are presently available which utilize only the light emitting element without a lens. However, the inventor has discovered that the light emitting element of diodes can be used effectively without any lens and in that how the element 22 is preferably used. An illuminating device, such as 10, having this configuration, i.e., one that utilizes a light emitting element without a lens, has several advantages: first it can illuminate an object more evenly and across a greater surface area. Second, light emitting element and its conductors can be made so small that they will be substantially invisible and hence provide an interesting and attractive esthetic aspect to any object thus illuminated.

The conductors 14 and 16 are formed on substrate 12 using standard thin film technology well known in the art. For example, the conductors may be formed by the following sequence:

a. a photoresist material is applied to the substrate 12 using, for example, a spin coater;
b. the substrate is baked for a duration sufficient to cure the photoresist (for example, 30 minutes);
c. An aligner is used to place a negative mask on the photoresist, the mask forming a with a pattern corresponding to the shape of the conductors;
d. the mask is exposed to UV light;
e. The substrate is soaked in a photoresist developer to remove the exposed photoresist;
f. The substrate is loaded in a plasma asher to be cleaned with oxygen;
g. The substrate is placed in a vacuum chamber,
h. Metal is deposited on the substrate using electrode beam evaporation;
i. The substrate is allowed to cool and is removed from the vacuum chamber;
j. The substrate is soaked in acetone to remove the residual photoresist.

Preferably, this process is performed on a large sheet of substrate so that several illuminating devices are made at the same time, disposed for example in a two dimensional array. After step (j) the final product may be inspected and then cut to the desired size and shape.

Figure 3:
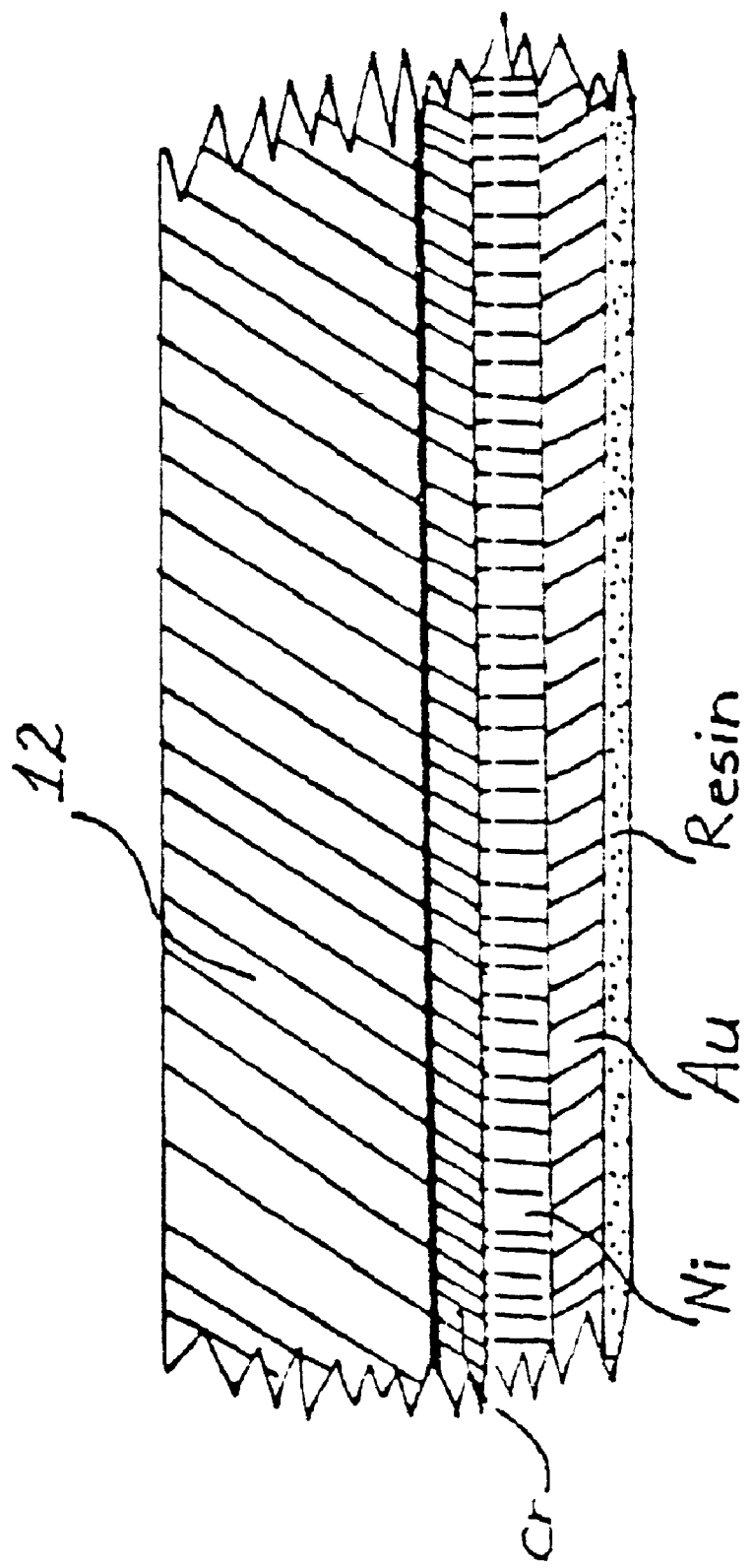
FIG. 3 shows an enlarged sectional view of the illumination device with details of the conductors.

The conductors may be formed integrally on the substrate using the process outlined above or other similar processes and can be made from gold, silver, copper, nickel as well as various alloys having a relatively low electrical resistivity. Moreover, it has been found that instead of using a single metal layer for forming the conductors, multiple layers may be used. For example, in step (h) three different layers may be deposited, as shown in FIG. 3: a layer of chromium Cr which adheres well to the glass substrate 12, a layer of nickel Ni which can be soldered easily; and a layer of gold Au which has a very small electrical resistance. Finally, a non-conductive resin may be added on top of the gold layer to protect the conductors during handling.

The first, or adhesive layer may also be made of titanium or a titanium tungsten alloy. The second layer may also be made of platinum or paladium. The third layer may also be made of silver, copper and other alloys. The second and third layers may be interchanged.

Alternatively, conductors 14, 16 may be made of a transparent or translucent material such as Indium Tin Oxide (ITO).

FIGS. 4 and 5 shows a cross-sectional view of a watch 30 and it illustrates how the subject invention may be used. The watch 30 includes a case 32, a dial 34 with indicia 36. A shaft 38 is used to turn two hands 40, 42 in the conventional manner. Disposed on top of the hands 40, 42 is the substrate 12 with the conductors 14, 16 and light emitting element 22 oriented downwardly so as to illuminate the dial 34 and the hands 40, 42.

As seen more clearly in FIG. 5, disposed under the dial 34 there is provided an IC chip 44 which provides the logic for the movement of the hands 40, 42 and/or the light emitting element 22. The chip 44 is connected to conductors 14, 16 by a coupling 46.

It should be understood that substrate 12 may be too fragile to protect the watch 30 adequately and therefore additional protective crystals or other transparent sheets (not shown) may be used to reinforce the substrate 12 as well.

In an alternate embodiment of the invention, the dial 34 can be illuminated from the bottom instead of, or as well as, the top. In this embodiment, the dial 34 may be made of a transparent or translucent material and an illuminating device 12A is positioned under the dial 32, essentially similar to the device 12. In this configuration, the light emitting element of the device 12A (not shown) is oriented upward so that its light penetrates through the dial 32. Advantageously, device 12A can be made as a discrete element, or it can be integral with the chip 44 or dial 34.

The subject device illustrated in FIGS. 1–3 has been described as being used to illuminate a watch. however, it may be used to illuminate many other apparatus as well, such as electronic devices, including cellular telephones, calculators, PDAs, and so on.

Element 22 can be emitting light at a single wave length, or alternatively it may be adapted to emit at several wave lengths, for example by providing several semiconductor junctions on the same substrate. In this latter configuration, additional wires may be required to provide appropriate excitation for the device.

Figure 6:
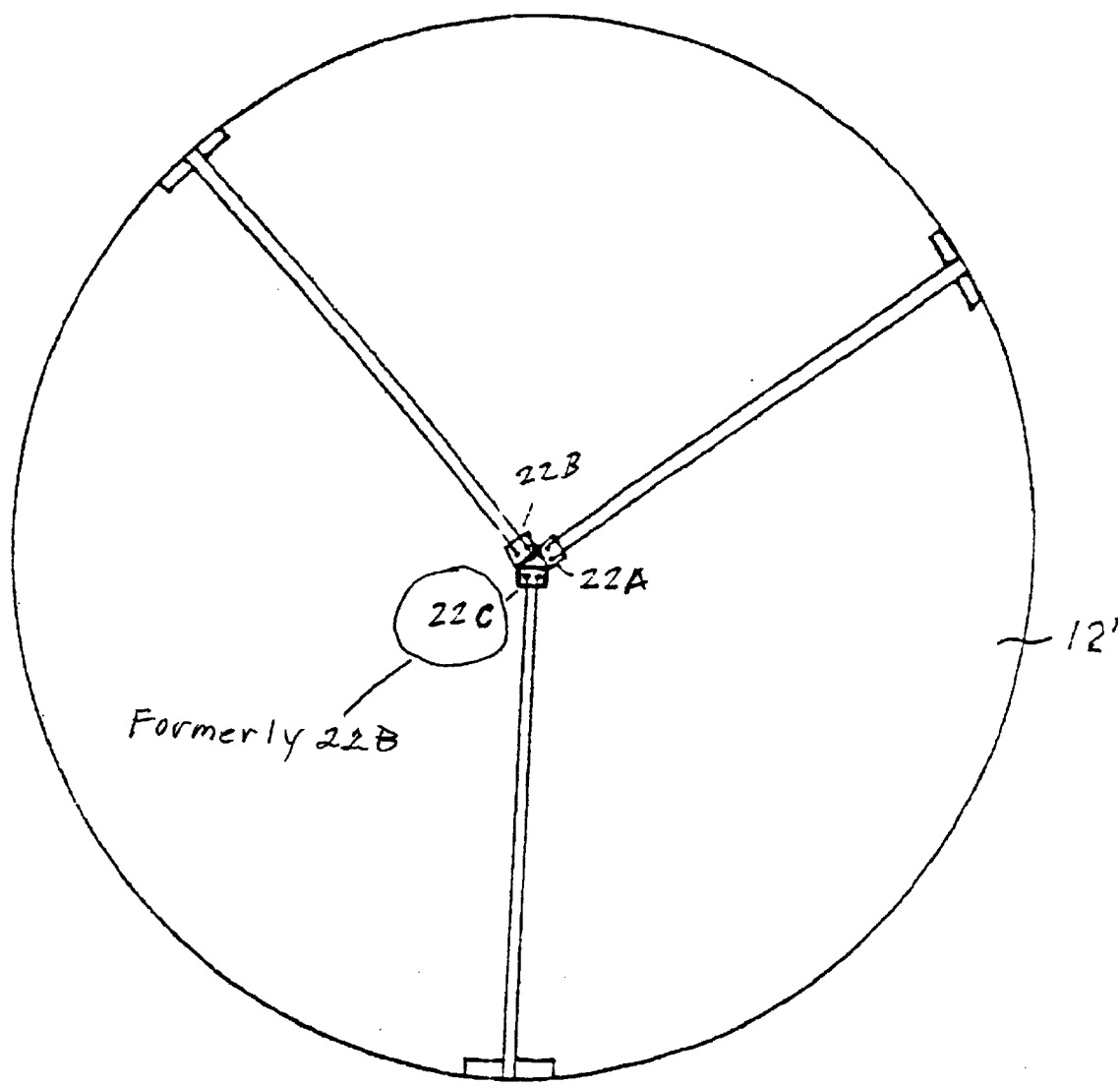
FIG. 6 shows a substrate with multi-colored light emitting elements.

FIG. 6 shows another embodiment of the invention wherein a plurality of light emitting elements, such as 22A, 22B and 22C are provided on a substrate 12'. Of course these elements may be distributed on the substrate 12' in any desired pattern and may be used to produce static or moving images on the substrate. Each of the elements may be connected to conductors C which provide excitation to these elements. In the drawings, the conductors C are shown as being formed in a radial pattern. However, the conductors may be arranged in any pattern. Moreover, two conductors C may be provided for each element, or some of the conductors may be shared, especially if more than one element is excited at a time.

The elements are energized by connecting the conductors associated therewith to appropriate mechanical and/or electronic switches well known in the art.

The light emitting elements in the multi-colored configurations may be formed into groupings of a red, a blue and a green element so that when properly excited, the elements can be used to form colored images.

Obviously, numerous other modifications may be made to the invention without departing from its scope as defined in the appended claims.

What is claimed:

1. A method of illuminating a device having a dial comprising the steps of:
   providing a substrate sufficiently large to cover a substantial portion of said dial;
   depositing on said substrate a plurality of conductors using thin film techniques;
   mounting on said substrate a light emitting element so that said light emitting element is electrically coupled to said conductors; and
   mounting said substrate over said dial with said light emitting element oriented to provide radiation toward said dial.

2. The method of claim 1 wherein said substrate is a transparent glass.

3. The method of claim 1 wherein said step of depositing said conductors includes depositing a layer of Cr on a glass, depositing a layer of Ni on the Cr and depositing a layer of Au on the Ni.

4. The method of claim 3 further comprising depositing a layer of a protective resin on the Au.

5. The method of claim 1 further comprising providing the light emitting element on a flip chip package having connecting bumps on one surface and connecting said bumps to said conductors.

6. The method of claim 1 wherein said light emitting elements are lensless so that their light is not concentrated.

7. The method of claim 1 further comprising arranging the light emitting elements in groupings of three on said substrate.

8. The method of claim 7 wherein each grouping includes a red, a green and a blue element.

9. A method of making an illuminating device comprising the steps of:
   providing a transparent substrate;
   depositing on said substrate a plurality of conductors using thin film techniques; and
   mounting on said substrate a light emitting element so that said light emitting element is electrically coupled to said conductors, said conductors providing power to said light emitting element;
   wherein during said step of depositing includes depositing a layer of Cr on transparent glass, depositing a layer of Ni on the Cr and depositing a layer of a conductive metal on the Ni, said layers extending between said light emitting element and an edge of said substrate.

10. The method of claim 9 wherein said conductive metal is selected from the group consisting of Au, Ag and Cu.

11. The method of claim 9 further comprising depositing a layer of a protective resin on the conductive metal.

* * * * *